(12) United States Patent
 Kasai

(10) Patent No.: US 11,309,683 B2
(45) Date of Patent: Apr. 19, 2022

(54) LASER MODULE AND LASER APPARATUS

(71) Applicant: Fujikura Ltd., Tokyo (JP)

(72) Inventor: Yohei Kasai, Chiba (JP)

(73) Assignee: Fujikura Ltd., Tokyo (JP)

(*) Notice: Subject to any disclaimer, the term of this patent is extended or adjusted under 35 U.S.C. 154(b) by 72 days.

(21) Appl. No.: 16/978,100

(22) PCT Filed: Dec. 18, 2018

(86) PCT No.: PCT/JP2018/046492
§ 371 (c)(1),
(2) Date: Sep. 3, 2020

(87) PCT Pub. No.: WO2019/187399
PCT Pub. Date: Oct. 3, 2019

(65) Prior Publication Data
US 2021/0013698 A1    Jan. 14, 2021

(30) Foreign Application Priority Data

Mar. 27, 2018  (JP) .............................. JP2018-059659

(51) Int. Cl.
*H01S 5/062*     (2006.01)
*H01S 5/022*     (2021.01)
(Continued)

(52) U.S. Cl.
CPC ........ *H01S 5/06236* (2013.01); *H01S 5/0021* (2013.01); *H01S 5/022* (2013.01); *H01S 5/06804* (2013.01)

(58) Field of Classification Search
CPC ......... H01S 5/06236; H01S 5/062; H01S 5/00
(Continued)

(56) References Cited

U.S. PATENT DOCUMENTS 8,432,945 B2 *  4/2013  Faybishenko ...... G02B 19/0028
                                                    372/36
2001/0008538 A1   7/2001  Nakano et al.
(Continued)

FOREIGN PATENT DOCUMENTS

JP    H07-302948 A    11/1995
JP    2010-245209 A   10/2010
(Continued)

OTHER PUBLICATIONS

Extended European Search Report issued in corresponding European Patent Application No. EP 18911614.8 dated Nov. 29, 2021 (7 pages).

*Primary Examiner* — Tuan N Nguyen
(74) *Attorney, Agent, or Firm* — Osha Bergman Watanabe & Burton LLP

(57) ABSTRACT

A laser module includes: a laser device that emits a laser beam including a major polarization component and a minor polarization component; a beam splitter that splits the laser beam into the major polarization component and the minor polarization component and that directs the major polarization component and the minor polarization component in different directions; an optical fiber that is optically coupled to the major polarization component split by the beam splitter and externally outputs the major polarization component; a package housing that houses the laser device and that has an inner surface including a minor polarization component irradiation portion that is irradiated by the minor polarization component split by the beam splitter; and a temperature measurement element that is attached to the package housing and that detects a temperature change of the minor polarization component irradiation portion.

12 Claims, 3 Drawing Sheets

(51) Int. Cl.
*H01S 5/068* (2006.01)
*H01S 5/00* (2006.01)

(58) Field of Classification Search
USPC .......................................................... 372/27
See application file for complete search history.

(56) References Cited

U.S. PATENT DOCUMENTS

| | | |
|---|---|---|
| 2005/0051712 A1 | 3/2005 | Komiyama |
| 2009/0299693 A1 | 12/2009 | Kane et al. |
| 2010/0226405 A1* | 9/2010 | Chuyanov .......... G02B 19/0052 |
| | | 372/50.12 |
| 2010/0290488 A1 | 11/2010 | Ko et al. |
| 2017/0133819 A1 | 5/2017 | Takigawa et al. |
| 2018/0013259 A1 | 1/2018 | Takigawa et al. |
| 2018/0156860 A1 | 6/2018 | Nakamura et al. |

FOREIGN PATENT DOCUMENTS

| | | |
|---|---|---|
| JP | 2011-523198 A | 8/2011 |
| JP | 2017-092206 A | 5/2017 |
| JP | 2018-006713 A | 1/2018 |
| WO | 2016/194556 A1 | 12/2016 |

\* cited by examiner

LASER MODULE AND LASER APPARATUS

CROSS-REFERENCE TO RELATED APPLICATIONS

This is a U.S. National Stage application of International Application No. PCT/JP2018/046492 filed Dec. 18, 2018, which claims priority from Japanese patent application No. 2018-059659 filed Mar. 27, 2018. These references are incorporated herein in their entirety by reference.

TECHNICAL FIELD

The present invention relates to a laser module and a laser apparatus, and more particularly to a laser module that can detect deficiency of the laser module.

BACKGROUND

As this type of laser modules, there has heretofore been known a laser module that detects a temperature change in the module with a temperature measurement element (for example, a thermistor) so as to detect any deficiency of the module (see, e.g., Patent Literature 1). With the configuration of the laser module disclosed in Patent Literature 1, however, when the size of the module increases because of a large number of laser devices mounted on the module or the like, a region outside of a detectable range of a temperature measurement element (undetectable region) may be produced so as to hinder accurate detection of a deficiency. For example, when a laser device located at an undetectable region fails in a laser module having a large number of laser devices mounted, then the failure is not detected. Therefore, an issue may arise that the cumulative number of failed laser devices cannot be accurately ascertained.

In order to deal with such an issue, a plurality of temperature measurement elements may be arranged in a wide area of a module to expand a detectable range. In this case, however, a large number of temperature measurement elements need to be provided in a module, resulting in an increased manufacturing cost and further increased size of the apparatus.

Patent Literature 1: JP 2010-245209 A

SUMMARY

One or more embodiments of the present invention provide a laser module capable of accurately detecting a deficiency of a module with a small number of temperature measurement elements.

One or more embodiments of the present invention provide a laser apparatus capable of calculating a residual lifetime of a laser module based on data from a temperature measurement element.

According to one or more embodiments, the laser module has at least one laser device configured to emit a laser beam. The laser beam includes a major polarization component and a minor polarization component having a power lower than a power of the major polarization component and a polarization direction inclined at an angle of 90 degrees with respect to the major polarization component. The laser module has a beam splitter configured to split the laser beam into the major polarization component and the minor polarization component and direct the major polarization component and the minor polarization component in different directions, an optical fiber configured to be optically coupled to the major polarization component split by the beam splitter to externally output the major polarization component, a package housing that houses the at least one laser device and has an inner surface including a minor polarization component irradiation portion to be irradiated with the minor polarization component split by the beam splitter, and at least one temperature measurement element attached to the package housing and configured to detect a temperature change of the minor polarization component irradiation portion. The phrase "attached to the package housing" intends to refer to a case where a temperature measurement element is attached directly to the package housing and a case where a temperature measurement element is attached indirectly to the package housing via a resin or the like.

According to one or more embodiments, the laser apparatus has the aforementioned laser module including a plurality of laser devices, a failure count calculator operable to calculate a cumulative number of failed laser devices at a point in time of operation of the laser module based on a signal from the at least one temperature measurement element, and a remaining lifetime calculator operable to calculate a residual lifetime of the laser module based on the cumulative number of failed laser devices calculated by the failure count calculator.

DETAILED DESCRIPTION

Figure 1:
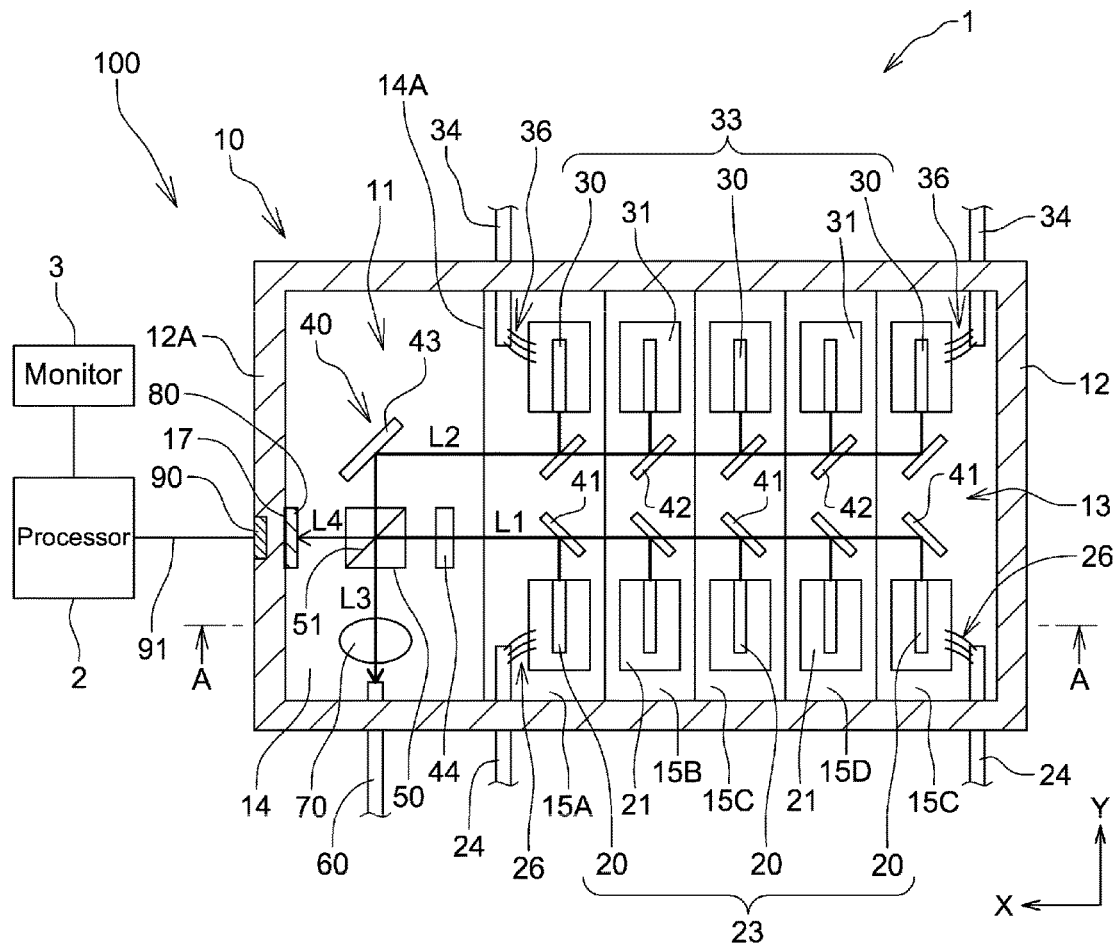
FIG. 1 is a cross-sectional and partial plan view schematically showing a laser apparatus according to a first embodiment of the present invention.

Laser modules according to one or more embodiments of the present invention will be described in detail below with reference to FIGS. 1 to 6. In FIGS. 1 to 6, the same or corresponding components are denoted by the same or corresponding reference numerals and will not be described below repetitively. Furthermore, in FIGS. 1 to 6, the scales or dimensions of components may be exaggerated, or some components may be omitted.

First Embodiment

FIG. 1 is a cross-sectional and partial plan view schematically showing a laser apparatus 100 according to a first embodiment of the present invention. As shown in FIG. 1, the laser apparatus 100 has a laser module 1, a processor 2 connected to the laser module 1, and a monitor 3 connected to the processor 2.

The laser module 1 of the laser apparatus 100 is operable to output laser beams from a plurality of laser devices to the exterior of the laser module 1 and to detect a temperature change of the module with a thermistor. The processor 2 of the laser apparatus 100 is operable to calculate a residual lifetime of the laser module 1 based on data from the thermistor. The monitor 3 of the laser apparatus 100 is operable to display the residual lifetime of the laser module 1 calculated by the processor 2.

As shown in FIG. 1, the laser module 1 includes a plurality of laser devices 20 (five in the present embodiment) operable to emit a laser beam along +Y-direction, a plurality of laser devices 30 (five in the present embodiment) operable to emit a laser beam along −Y-direction, optics 40 configured to change the propagation direction and the polarization direction of the laser beams, a beam splitter 50 configured to split the laser beams into two polarization components (major polarization components and minor polarization components) and direct the split two polarization components in different directions, a package housing 10 that houses the laser devices 20, 30, and the like mounted therein, a condenser lens 70 configured to condense the major polarization components split by the beam splitter 50, an optical fiber 60 configured to be optically coupled to the major polarization components condensed by the condenser lens 70 to externally output the major polarization components, a laser beam absorption member 80 disposed on an optical path of the minor polarization components split by the beam splitter 50, and a thermistor 90 (temperature measurement element).

The five laser devices 20 are arranged on a straight line along the X-direction at the −Y side of the package housing 10. The five laser devices 20 constitute a first laser device group 23. Lead wires 24 are connected via bonding wires 26 respectively to the laser device 20 that is located at the endmost position of the first laser device group 23 in the −X-direction and the laser device 20 that is located at the endmost position of the first laser device group 23 in the +X-direction. Furthermore, the five laser devices 20 are connected to each other via bonding wires, which are not shown in the drawings. With this configuration, when electric power is supplied via the lead wires 24, laser beams L1 are emitted from the first laser device group 23 in the +Y-direction. Each of the laser beams L1 includes a TE mode as a major polarization component and a TM mode as a minor polarization component. In the present embodiment, the TM mode (minor polarization component) of the laser beams L1 has a power that is about 1% to 5% of a power of the TE mode (major polarization component) of the laser beams L1.

The five laser devices 30 are arranged on a straight line along the X-direction at the +Y side of the package housing 10. The five laser devices 30 constitute a second laser device group 33. Lead wires 34 are connected via bonding wires 36 respectively to the laser device 30 that is located at the endmost position of the second laser device group 33 in the −X-direction and the laser device 30 that is located at the endmost position of the second laser device group 33 in the +X-direction. Furthermore, the five laser devices 30 are connected to each other via bonding wires, which are not shown in the drawings. With this configuration, when electric power is supplied via the lead wires 34, laser beams L2 are emitted from the second laser device group 33 in the −Y-direction. Each of the laser beams L2 includes a TE mode as a major polarization component and a TM mode as a minor polarization component as with the laser beams L1. In the present embodiment, the TM mode of the laser beams L2 has a power that is about 1% to 5% of a power of the TE mode of the laser beams L2.

Figure 2:
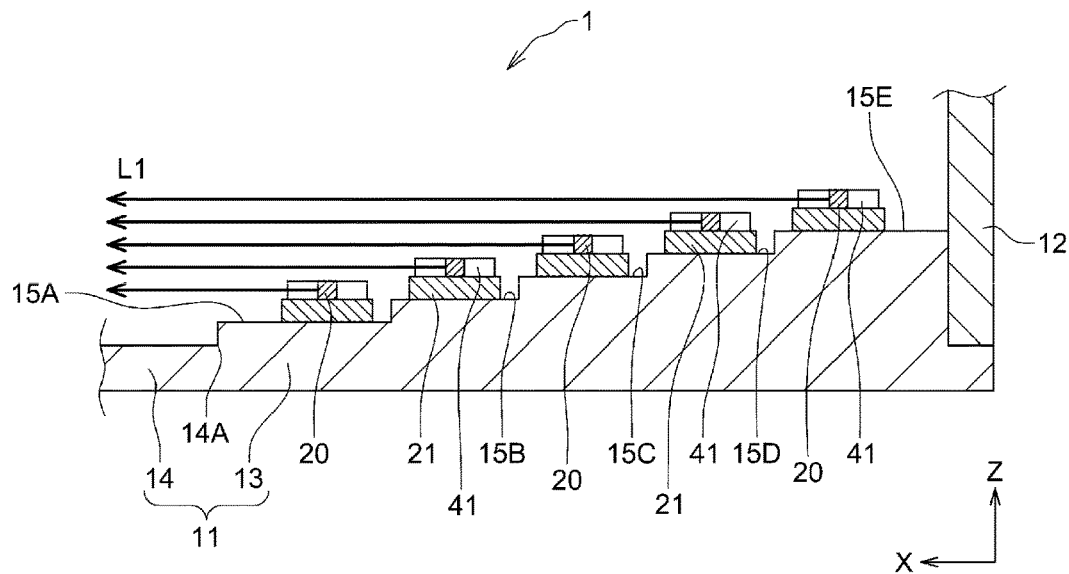
FIG. 2 is a cross-sectional and partial plan view schematically showing a portion of a cross section taken along A-A line of FIG. 1.

FIG. 2 is a diagram schematically showing a portion of a cross section of the laser module 1 illustrated in FIG. 1 that is taken along A-A line. In FIG. 2, the lead wires, the bonding wires, and the like are omitted from the illustration to facilitate the understanding.

As shown in FIGS. 1 and 2, the package housing 10 includes a bottom plate 11 having a generally rectangular shape in the plan view of FIG. 1 and a frame 12 fixed on a peripheral portion of the bottom plate 11. The package housing 10 is formed of metal such as copper, which has a good thermal conductivity. The bottom plate 11 of the package housing 10 includes a base portion 14 and a stepped portion 13, which is located on the −X side of an end portion 14A of the base portion 14 in the −X-direction. The stepped portion 13 has five mount surfaces 15A-15E arranged at different heights in the Z-direction such that the height of the mount surfaces increases toward the −X-direction. (The stepped portion 13 has mount surfaces 15A, 15B, 15C, 15D, and 15E from the +X side toward the −X side.) The laser device 20 is mounted via a submount 21 in the vicinity of an end of each of the mount surfaces 15A-15E on the +Y side. The laser device 30 is mounted via a submount 31 in the vicinity of an end of each of the mount surfaces 15A-15E on the −Y side.

As shown in FIG. 1, a plurality of reflection mirrors 41 (five in the present embodiment) are disposed forward in the emission direction of the laser beams L1 emitted from the first laser device group 23 (+Y-direction). Specifically, a reflection mirror 41 is mounted on each of the mount surfaces 15A-15E. Each of those reflection mirrors 41 is fixed in a state in which the reflection mirror 41 is inclined at an angle of 45° with respect to the X-direction and the Y-direction in the plan view of FIG. 1. Therefore, the direction of the laser beams L1 emitted from the laser device group 23 is changed by 90° at the reflection mirrors 41, resulting in the laser beams L1 propagating in the +X-direction.

Collimator lenses (not shown) are disposed between emission ends of the semiconductor laser devices 20 and the reflection mirrors 41. Therefore, the laser beams L1 are collimated and reduced in angle of divergence before they reach the reflection mirrors 41. This holds true for the second embodiment described later.

A half-wave plate 44 is disposed forward in the propagation direction of the laser beams L1 that have been changed in direction at the reflection mirrors 41 (+X-direction). The half-wave plate 44 is fixed on the base portion 14 of the bottom plate 11. The half-wave plate 44 serves to rotate the polarization direction of the laser beams L1 through 90°. Therefore, when the laser beams L1 pass through the half-wave plate 44, the polarization directions of the major polarization components (TE mode) and the minor polarization components (TM mode) of the laser beams L1 are respectively rotated through 90°.

A beam splitter 50 is disposed on a portion of the base portion 14 that is located in front of the half-wave plate 44. Thus, the laser beams L1 that have passed through the half-wave plate 44 are incident on the beam splitter 50. The beam splitter 50 of the present embodiment is formed of two right-angle prisms. Each of the two right-angle prisms has an inclined surface that is inclined at an angle of 45° with respect to the X-direction and the Y-direction. The inclined surfaces of the two right-angle prisms are abutted on each other to form the beam splitter 50. An optical thin film 51 of a multilayer dielectric film, a thin metal film, or the like is formed on one of those inclined surfaces. According to this configuration, a polarized wave that is horizontal to the optical thin film 51 reflects on the optical thin film 51 and changes the direction by 90°, whereas a polarized wave that is vertical to the optical thin film 51 transmits through the optical thin film 51.

As described above, the polarization direction of the major polarization components (TE mode) of the laser beams L1 that have passed through the half-wave plate 44 has been rotated through 90°. Thus, the major polarization components are horizontal to the optical thin film 51. Therefore, the major polarization components of the laser beams L1 reflect on the optical thin film 51 and change the direction by 90°. Accordingly, the major polarization components of the laser beams L1 propagate in the −Y-direction. Meanwhile, the polarization direction of the minor polarization components (TM mode) of the laser beams L1 that have passed through the half-wave plate 44 has been rotated through 90°. Thus, the minor polarization components are vertical to the optical thin film 51. Therefore, the minor polarization components of the laser beams L1 transmit through the optical thin film 51 and propagate in the +X-direction.

As shown in FIG. 1, a plurality of reflection mirrors 42 (five in the present embodiment) are disposed forward in the emission direction of the laser beams L2 emitted from the second laser device group 33 (−Y-direction). Specifically, a reflection mirror 42 is disposed on each of the mount surfaces 15A-15E. Each of those reflection mirrors 42 is fixed in a state in which the reflection mirror 42 is inclined at an angle of 45° with respect to the X-direction and the Y-direction in the plan view of FIG. 1. However, the reflection mirrors 42 are inclined reversely to the reflection mirrors 41. Therefore, the direction of the laser beams L2 emitted from the laser device group 33 is changed by 90° at the reflection mirrors 42, resulting in the laser beams L2 propagating in the +X-direction.

Collimator lenses (not shown) are disposed between emission ends of the semiconductor laser devices 30 and the reflection mirrors 42. Therefore, the laser beams L2 are collimated and reduced in angle of divergence before they reach the reflection mirrors 42.

A reflection mirror 43, which is inclined in the same direction as the reflection mirrors 42, is disposed forward in the propagation direction of the laser beams L2 that have been changed in direction at the reflection mirrors 42 (+X-direction). The reflection mirror 43 is fixed on the base portion 14. The reflection mirror 43 and the beam splitter 50 are arranged on a straight line in the Y-direction. Therefore, the laser beams L2 reflect on the reflection mirror 43 and change the direction by 90°. Accordingly, the laser beams L2 propagate in the −Y-direction. Thus, the laser beams L2 are incident on the beam splitter 50, which is located forward in the propagation direction (−Y-direction).

As described above, the major polarization components of the laser beams L2 have TE modes, which are vertical to the optical thin film 51 of the beam splitter 50. Therefore, when the laser beams L2 reach the beam splitter 50, the major polarization components of the laser beams L2 transmit through the optical thin film 51 and propagate in the −Y-direction. Meanwhile, the minor polarization components of the laser beams L2 have TM modes, which are horizontal to the optical thin film 51. Therefore, when the laser beams L2 reach the beam splitter 50, the minor polarization components of the laser beams L2 reflect on the optical thin film 51 and change the direction by 90°. Accordingly, the minor polarization components of the laser beams L2 propagate in the +X-direction.

In this manner, when the laser beams L1 from the first laser device group 23 and the laser beams L2 from the second laser device group 33 are incident on the beam splitter 50, the major polarization components of the laser beams L1 that have reflected on the optical thin film 51 and the major polarization components of the laser beams L2 that have transmitted through the optical thin film 51 are combined into combined major polarization components L3, which propagate in the −Y-direction. Meanwhile, the minor polarization components of the laser beams L1 that have transmitted through the optical thin film 51 and the minor polarization components of the laser beams L2 that have reflected on the optical thin film 51 are combined into combined minor polarization components L4, which propagate in the +X-direction.

As shown in FIG. 1, a condenser lens 70 is disposed forward in the propagation direction of the combined major polarization components L3 (−Y-direction). Furthermore, an optical fiber 60 is disposed in front of the condenser lens 70. Therefore, the combined major polarization components L3 are condensed by the condenser lens 70, optically coupled to an end of the optical fiber 60, and outputted to the exterior of the package housing 10.

Meanwhile, a +X side wall portion 12A of the frame 12 is located forward in the propagation direction of the combined minor polarization components L4 (+X-direction). A laser beam absorption member 80 is attached to a portion of an inner surface of the +X side wall portion 12A to be irradiated with the combined minor polarization components L4 (minor polarization component irradiation portion 17). The laser beam absorption member 80 may not necessarily be attached to the inner surface of the package housing, which will be described later.

The following portions are herein referred to as a "minor polarization component irradiation portion."

(1) In a case where the laser beam absorption member and the like are attached to the inner surface of the package housing, a portion of the inner surface of the package housing that is to be irradiated with the minor polarization components that have been split by the beam splitter on the assumption that the laser beam absorption member and the like are not attached to the inner surface of the package housing.

(2) In a case where the laser beam absorption member and the like are not attached to the inner surface of the package housing, a portion of the inner surface of the package housing that is to be irradiated with the minor polarization components that have been split by the beam splitter.

The aforementioned laser beam absorption member 80 is formed of a material having a high laser absorptance (i.e., a high thermal resistance), such as plastic of polyetheretherketone (PEEK), black-plated stainless steel (SUS), or black-alumite aluminum.

As shown in FIG. 1, the thermistor 90 is attached as a temperature measurement element to an opposite side of the minor polarization component irradiation portion 17 to the beam splitter 50 in the propagation direction of the combined minor polarization components L4. More specifically, a recessed hole is formed in a portion of an outer surface of the +X side wall portion 12A that is opposed to the laser beam absorption member 80. The thermistor 90 is embedded in the recessed hole and fixed in the recessed hole by a resin having a high thermal conductivity. For example, a tapped hole may be formed in the aforementioned outer surface so that the thermistor 90 is fixed by a screw, instead of use of a resin for fixing the thermistor 90.

With the above configuration, the combined minor polarization components L4 propagating in the +X-direction is irradiated to the laser beam absorption member 80 and converted to heat. The thermistor 90 detects a temperature change caused by the heat.

Now an operation of the laser module 1 will be described. When electric power is supplied to the laser module 1, laser beams L1 are emitted from the first laser device group 23 in the +Y-direction. Each of the laser beams L1 reflects on the reflection mirror 41, changes the direction by 90°, and propagates in the +X-direction. When the laser beams L1 then pass through the half-wave plate 44, the polarization direction of the laser beams L1 is rotated through 90°. In this state, the laser beams L1 are incident on the beam splitter 50. The major polarization components of the laser beams L1 reflect on the optical thin film 51 of the beam splitter 50, change the direction by 90°, and propagate in the −Y-direction. The minor polarization components of the laser beams L1 transmit through the optical thin film 51 and propagate in the +X-direction.

When electric power is supplied to the laser module 1, laser beams L2 are emitted from the second laser device group 33 in the −Y-direction. Each of the laser beams L2 reflects on the reflection mirror 42, changes the direction by 90°, and propagates in the +X-direction. The laser beams L2 further reflect on the reflection mirror 43 and propagate in the −Y-direction. Thus, the laser beams L2 are incident on the beam splitter 50. The major polarization components of the laser beams L2 transmit through the optical thin film 51 of the beam splitter 50 and propagate in the −Y-direction. The minor polarization components of the laser beams L2 reflect on the optical thin film 51, change the direction by 90°, and propagate in the +X-direction.

The major polarization components of the laser beams L1 reflect on the optical thin film 51. The major polarization components of the laser beams L2 transmit through the optical thin film 51. Therefore, those major polarization components are combined into combined major polarization components L3. The combined major polarization components L3 are condensed by the condenser lens 70, coupled to the optical fiber 60, and outputted to the exterior of the laser module 1. On the other hand, the minor polarization components of the laser beams L1 transmit through the optical thin film 51. The minor polarization components of the laser beams L2 reflect on the optical thin film 51. Therefore, those minor polarization components are combined into combined minor polarization components L4. The combined minor polarization components L4 are irradiated to the laser beam absorption member 80, which has been attached to the minor polarization component irradiation portion 17 of the +X side wall portion 12A.

As described above, the optics 40 for changing the propagation direction and the polarization direction of the laser beams include the reflection mirrors 41, 42, and 43 for guiding the laser beams L1 and L2 to the beam splitter 50 and the half-wave plate 44 for rotating the polarization direction of the laser beams L1 through 90°. According to the present embodiment, the reflection mirror 41, 42, and 43, the half-wave plate 44, and the beam splitter 50 can achieve splitting and combining of the major polarization components and the minor polarization components of the laser beams L1 and L2. Thus, the combined major polarization components L3 can be outputted to the exterior of the laser module 1 while the combined minor polarization components L4 can be directed to the laser beam absorption member 80.

As the combined minor polarization components L4 are irradiated to the laser beam absorption member 80, the temperature of the laser beam absorption member 80 increases. For example, assuming that the output of each of the laser devices 20 and 30 is 10 W, the power of the minor polarization component from each of the laser devices 20 and 30 is 1% of the major polarization component, and the thermal resistance of the laser beam absorption member 80 is 10° C./W, the irradiation of the minor polarization component from one laser device increases the temperature of the laser beam absorption member 80 by about 1° C. Since the combined minor polarization components L4 are a combination of the minor polarization components from the ten laser devices 20 and 30, the temperature of the laser beam absorption member 80 increases by about 10° C. when the laser beam absorption member 80 is irradiated with the combined minor polarization components L4. For example, if one of the laser devices 20 and 30 fails, the temperature of the laser beam absorption member 80 increases by about 9° C. If five of the laser devices 20 and 30 fail, the temperature of the laser beam absorption member 80 increases by about 5° C.

According to the present embodiment, the +X side wall portion 12A is interposed between the laser beam absorption member 80 and the thermistor 90. In other words, metal (copper) having a good thermal conductivity is interposed between the laser beam absorption member 80 and the thermistor 90. Therefore, heat is transferred from the laser beam absorption member 80 to the thermistor 90. According to the present embodiment, the thermistor 90 is opposed to the laser beam absorption member 80. Accordingly, the heat can effectively be transferred from the laser beam absorption member 80 to the thermistor 90. Particularly, according to the present embodiment, the overall width of the thermistor 90 is opposed to the laser beam absorption member 80 in the plan view of FIG. 1. Therefore, the heat can be transferred from the laser beam absorption member 80 to the thermistor 90 in a more effective manner.

An electric current corresponding to the heat that has been transferred from the laser beam absorption member 80 flows from the thermistor 90 to the processor 2 via a wire 91. The processor 2 calculates the cumulative number of failed laser devices, the residual lifetime of the laser module 1, and the like based on the electric current (signal).

Figure 3:
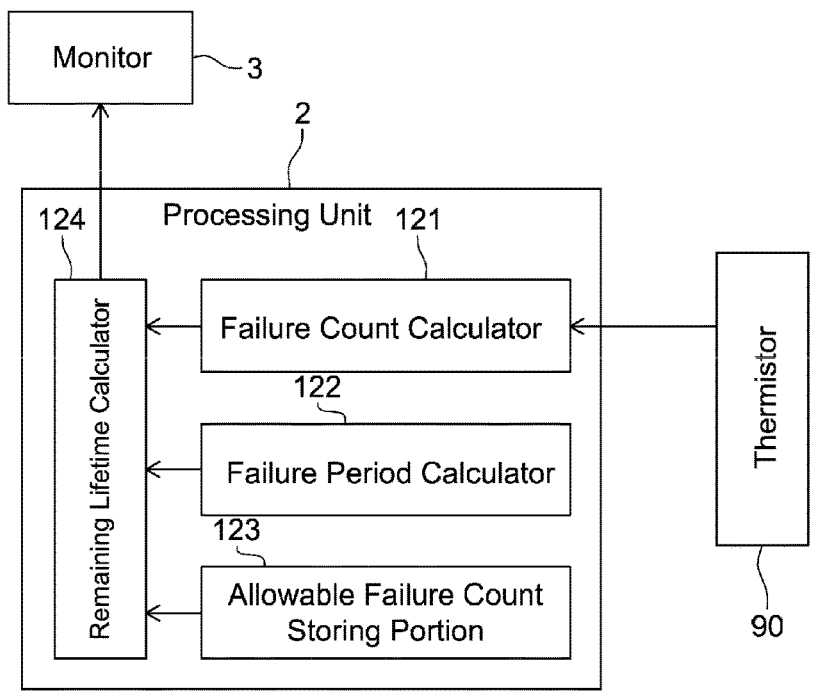
FIG. 3 is a block diagram schematically showing a functional configuration of a determination unit of the laser apparatus illustrated in FIG. 1.

An operation of the processor 2 will be described below. FIG. 3 is a block diagram showing an example of a functional configuration of the processor 2. As shown in FIG. 3, the processor 2 includes a failure count calculator 121, a failure period calculator 122, an allowable failure count storing portion 123, and a remaining lifetime calculator 124.

The failure count calculator 121 is connected to the thermistor 90 and the remaining lifetime calculator 124. When a signal is inputted to this failure count calculator 121 from the thermistor 90, the failure count calculator 121 calculates the cumulative number of failed laser devices 20 and 30 (n) at a point in time of operation of the laser module 1 (t). For example, assuming that one laser device has failed at a point in time of operation (t), heat that has been transferred from the laser beam absorption member 80 to the thermistor 90 causes a temperature decrease of about 1° C. as compared to a case where no laser devices have failed, according to the above example. An electric current corresponding to this temperature change flows from the thermistor 90 to the failure count calculator 121, which calculates that the cumulative number of failed laser devices (n) is one at the point in time of operation (t). Furthermore, assuming that five laser devices have failed at a point in time of operation (t), heat that has been transferred from the laser beam absorption member 80 to the thermistor 90 causes a temperature decrease of about 5° C. as compared to a case where no laser devices have failed, according to the above example. An electric current corresponding to this temperature change flows from the thermistor 90 to the failure count calculator 121, which calculates that the cumulative number of failed laser devices (n) is five at the point in time of operation (t). As described above, the failure count calculator 121 calculates the cumulative number of failed laser devices (n) at the point in time of operation (t) based on the current (signal) provided from the thermistor 90.

The failure period calculator 122 is connected to the remaining lifetime calculator 124. The failure period calculator 122 calculates an average time-to-failure (T) of the ten laser devices 20 and 30 based on an electric current supplied to the laser module 1 at the point in time of operation (t). More specifically, it has generally been known that the random failure rate of a laser device is determined by an optical output and a junction temperature of the laser device. Individual differences in the optical output and the junction temperature are small. When the ten laser devices 20 and 30 have the same configuration (i.e., the same IL characteristics), the optical output and the junction temperature of the laser devices 20 and 30 are estimated based on the IL characteristics of the laser devices 20 and 30, the cooling capacity of the laser module 1, and the drive current at the point in time of operation (t) in a state in which the temperature of the flow rate of cooling water for the laser module 1 are made constant. As a result, the random failure rate of each of the semiconductor laser devices is calculated. The failure period calculator 122 calculates an average time-to-failure (T) of the laser devices 20 and 30 based on the calculated random failure rate and outputs data relating to the average time-to-failure (T) to the remaining lifetime calculator 124.

The allowable failure count storing portion 123 is connected to the remaining lifetime calculator 124. The allowable failure count storing portion 123 stores therein the permissible number of failed laser devices 20 and 30 (N) in the laser module 1. Meanwhile, a fiber laser system is designed with redundancy. Thus, a laser device can output the maximum rating power with an electric current that is less than the maximum rating current of the laser device. Accordingly, even if a semiconductor laser device fails, the decreased amount of the power can be compensated by an increased drive current. However, when the cumulative period of time during which the system is being operated reaches a certain value, the output of the fiber laser does not reach the maximum rating power even if the drive current is increased up to the maximum rating current. (In other words, the decreased amount of power for the failed laser device is not fully compensated.) In the specification, the "permissible number of failed laser devices (N)" is defined as the number of failed laser devices at this point in time of the cumulative operation (i.e., when the decreased amount of power is not fully compensated). The allowable failure count storing portion 123 outputs data relating to this permissible number of failed laser devices (N) to the remaining lifetime calculator 124.

The remaining lifetime calculator 124 is connected to the failure count calculator 121, the failure period calculator 122, the allowable failure count storing portion 123, and the monitor 3. When the data relating to the cumulative number of devices (n) from the failure count calculator 121, the data relating to the average time-to-failure (T) from the failure period calculator 122, and the data relating to the average time-to-failure number of failed laser devices (N) from the allowable failure count storing portion 123 are inputted to the remaining lifetime calculator 124, then the remaining lifetime calculator 124 calculates (predicts) the residual lifetime (D) of the laser module 1 at the point in time of operation (t) by the formula:

$$D=(N-n)\times T.$$

The remaining lifetime calculator 124 outputs data relating to the calculated residual lifetime (D) to the monitor 3. As a matter of course, the residual lifetime (D) may be calculated based on other algorithms.

When the data relating to the residual lifetime (D) are inputted from the remaining lifetime calculator 124 of the processor 2, the monitor 3 processes and shows the data on a display.

Effects of the laser module 1 and the laser apparatus 100 in the present embodiment will be described below.

According to the laser module 1 of the present embodiment, minor polarization components from a plurality of laser devices can be collected to one location (the minor polarization component irradiation portion 17). Therefore, any failure or deficiency of the laser device(s) can be detected accurately by one thermistor arranged at a location to which heat is transferred from the minor polarization component irradiation portion 17 (the location opposed to the minor polarization component irradiation portion in the present embodiment).

When the heat from the minor polarization component irradiation portion cannot satisfactorily be detected with one thermistor, a plurality of thermistors may be provided. Even in such a case, the number of failed laser devices can accurately be detected if the heat at the minor polarization component irradiation portion can be detected. Therefore, a plurality of semiconductor laser devices do not need to be arranged in a wide range of the package housing. Accordingly, any failure of the laser devices can accurately be detected with less thermistors as compared to conventional laser modules.

According to the laser module 1 of the present embodiment, since the laser beam absorption member 80 is provided in the minor polarization component irradiation portion 17, the combined minor polarization components L4 can efficiently be converted to heat. Therefore, any temperature change due to failure of laser devices or the like can be detected more accurately.

In another embodiment, such a laser beam absorption member may not necessarily be provided. When no laser beam absorption member is provided, the minor polarization component irradiation portion may be masked to form a non-plated portion or to conduct black-alumite processing on the minor polarization component irradiation portion in order to enhance the laser absorptance of the minor polarization component irradiation portion.

Furthermore, according to the laser module 1 of the present embodiment, the thermistor 90 is opposed to the laser beam absorption member 80 while metal (copper) having a good thermal conductivity is interposed therebetween. Therefore, heat can effectively be transferred from the laser beam absorption member 80 to the thermistor 90. Moreover, the thermistor 90 is embedded in the outer surface of the package housing 10. Accordingly, the thermistor 90 is located closer to the laser beam absorption member 80 as compared to a case where the thermistor 90 is attached on the outer surface. As a result, heat can more effectively be transferred from the laser beam absorption member 80 to the thermistor 90.

According to the laser apparatus 100 including the laser module 1 as described above, heat (temperature change) can accurately be detected from the laser beam absorption member 80 (the minor polarization component irradiation portion 17) with the thermistor 90. Thus, the number of failed laser devices can accurately be detected. Therefore, the residual lifetime of the laser module can be calculated (predicted) with high precision. Furthermore, according to the laser apparatus 100 of the present embodiment, the residual lifetime can be calculated based on data from one thermistor. Accordingly, the algorithm for calculating the residual lifetime can be simplified as compared to a case where a plurality of thermistors are attached.

Second Embodiment

Figure 4:
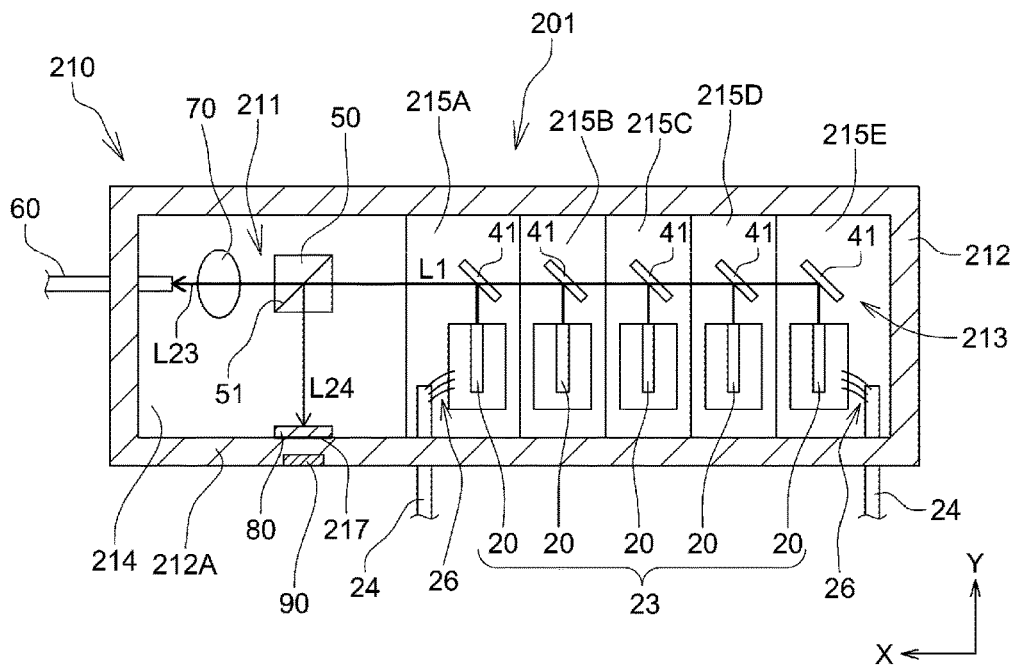
FIG. 4 is a cross-sectional and partial plan view schematically showing a laser module according to a second embodiment of the present invention.

Next, a laser module 201 according to a second embodiment of the present invention will be described below. FIG. 4 is a cross-sectional and partial plan view schematically showing the laser module 201. As shown in FIG. 4, the laser module 201 has a package housing 210. The package housing 210 includes a bottom plate 211 and a frame 212 fixed on a peripheral portion of the bottom plate 211. The bottom plate 211 is formed so as to have a size that is about half of the bottom plate 11 of the first embodiment. The bottom plate 211 includes a base portion 214 and a stepped portion 213. The stepped portion 213 has five mount surfaces 215A-215E arranged such that the height of the mount surfaces increases toward the −X-direction. The laser device 20 and the reflection mirror 41 are fixed on each of those mount surfaces 215A-215E. Specifically, the laser module 201 only includes the first laser device group 23, unlike the laser module 1 of the first embodiment.

Laser beams L1 emitted from the first laser device group 23 reflect on the reflection mirrors 41, change the direction by 90°, and propagate in the +X-direction. The laser beams L1 are incident on the beam splitter 50, which is located frontward in the propagation direction of the laser beams L1 (+X-direction). As described above, major polarization components of the laser beams L1 have a TE mode, which are vertical to the optical thin film 51 of the beam splitter 50. Therefore, the major polarization components of the laser beams L1 transmit through the optical thin film 51 and propagate as transmitting major polarization components L23 in the +X-direction. The transmitting major polarization components L23 are condensed by the condenser lens 70, which is fixed frontward in the propagation direction of the transmitting major polarization components L23, coupled to the optical fiber 60, which is disposed frontward of the condenser lens 70, and outputted in the +X-direction.

As described above, the minor polarization components of the laser beams L1 have a TM mode, which are horizontal to the optical thin film 51 of the beam splitter 50. Therefore, the minor polarization components of the laser beams L1 reflect on the optical thin film 51, change the direction by 90°, and propagate as reflecting minor polarization components L24 in the −Y-direction. A −Y side wall portion 212A of the frame 212 is located forward in the propagation direction of the reflecting minor polarization components L24 (−Y-direction). The laser beam absorption member 80 is provided on a portion of an inner surface of the wall portion 212A to be irradiated with the reflecting minor polarization components L24 (the minor polarization component irradiation portion 217). The thermistor 90 is embedded in the −Y side wall portion 212A so as to be opposed to the laser beam absorption member 80. With this configuration, the reflecting minor polarization components L24 are irradiated to the laser beam absorption member 80 and converted to heat, which is effectively transferred to the thermistor 90. Particularly, according to the present embodiment, the overall width of the thermistor 90 is opposed to the laser beam absorption member 80 in the plan view (see FIG. 4) as with the first embodiment. Therefore, the heat can be transferred to the thermistor 90 in a more effective manner.

As described above, according to the laser module 201 of the present embodiment, minor polarization components from a plurality of laser devices can be collected to one location (the minor polarization component irradiation portion 217) as with the laser module 1 of the first embodiment. Therefore, any failure or deficiency of the laser device(s) can be detected accurately by a small number of thermistors (one thermistor in the present embodiment) arranged at a location to which heat is transferred from the portion 217.

The laser module 201 of the present embodiment does not need the half-wave plate as arranged above.

Third Embodiment

Figure 5:
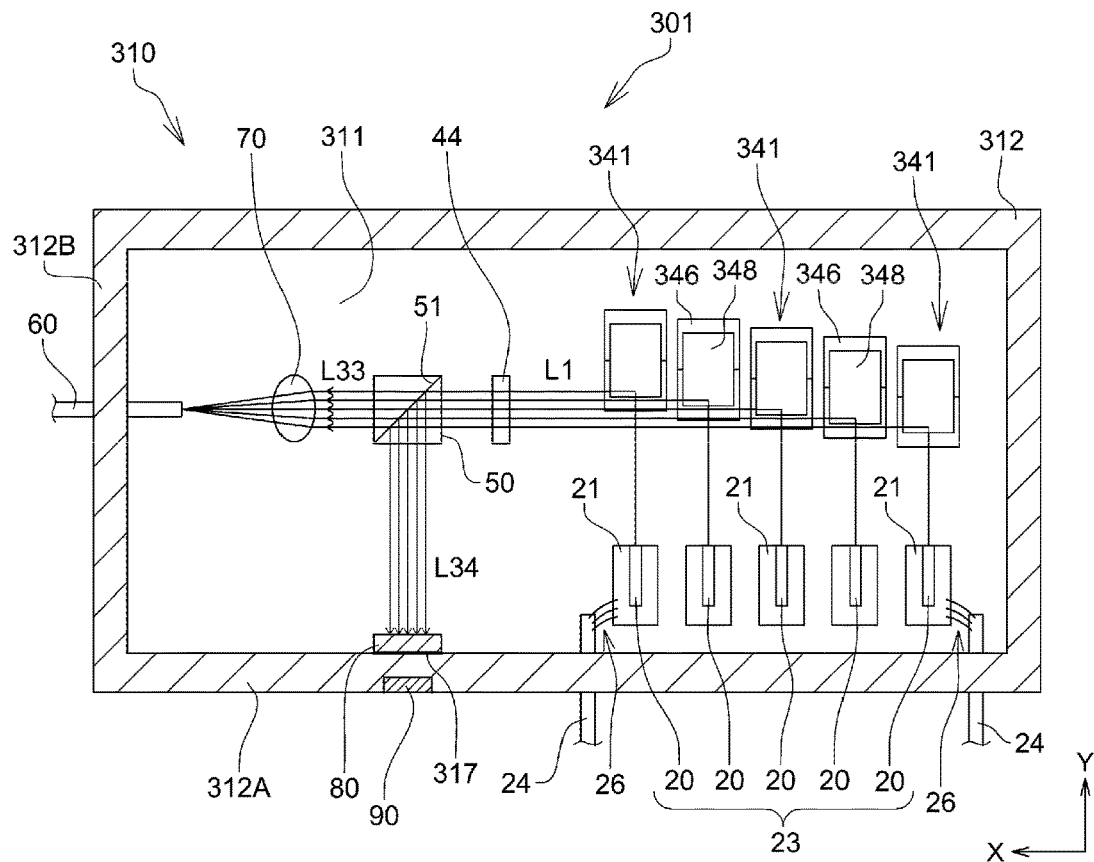
FIG. 5 is a cross-sectional and partial plan view schematically showing a laser module according to a third embodiment of the present invention.

Next, a laser module 301 according to a third embodiment of the present invention will be described below. FIG. 5 is a cross-sectional and partial plan view schematically showing the laser module 301. As shown in FIG. 5, the laser module 301 has a package housing 310. The package housing 310 includes a flat bottom plate 311 and a frame 312 fixed on a peripheral portion of the bottom plate 311. Five laser devices 20 (i.e., the aforementioned first laser device group 23) are mounted on the bottom plate 311 via the submount 21. Furthermore, five reflection mirror units 341, a half-wave plate 44, a beam splitter 50, and a condenser lens 70 are also mounted on the bottom plate 311.

The five reflection mirror units 341 are arranged and deviated from each other with a certain pitch in the Y-direction. The reflection mirror unit 341 that is located at the endmost position on the −X side is closest to the corresponding laser device. The reflection mirror unit 341 that is located at the endmost position on the +X side is farthest from the corresponding laser device.

Collimator lenses (not shown) for collimating a laser beam emitted from each of the semiconductor laser devices 20 are disposed between emission ends of the semiconductor laser devices 20 and the reflection mirror units 341. Therefore, the laser beams L1 are collimated and reduced in angle of divergence before they reach the reflection mirror units 341.

Each of the reflection mirror units 341 serves to change the propagation direction of a laser beam emitted from the corresponding laser device 20 with a set of mirrors. In the present embodiment, the direction of the laser beams L1 emitted from the first laser device group 23 in the +Y-direction is changed to the +X-direction with five reflection mirror units 341. At the time of emission of the laser beams L1, the major polarization components of the laser beams L1 have a TE mode, and the minor polarization components of the laser beams L1 have a TM mode.

Figure 6:
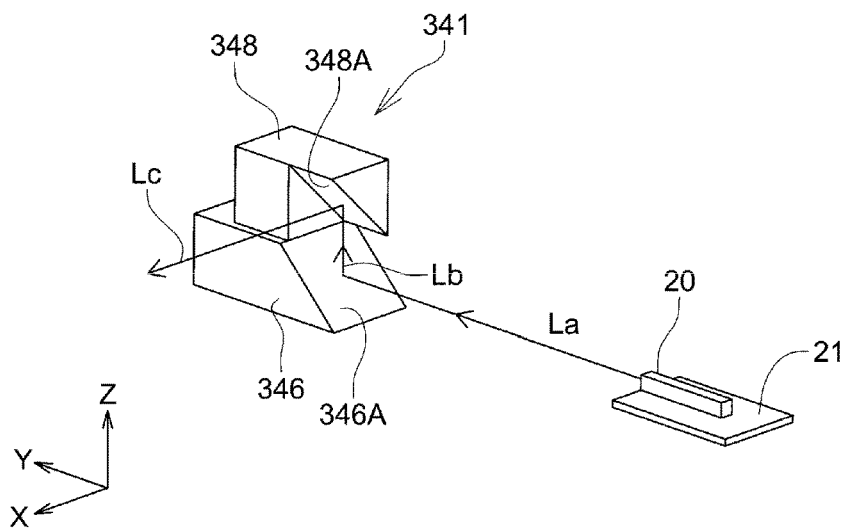
FIG. 6 is a perspective view schematically showing a reflection mirror in the laser module illustrated in FIG. 5.

As shown in FIG. 6, each of the reflection mirror units 341 includes a vertical flip mirror 346 and a horizontal flip mirror 348 placed on the vertical flip mirror 346. The vertical flip mirror 346 has a trapezoidal shape on the XY-plane and has a reflection surface 346A with an angle of 45° with respect to the +X-direction on the XY-plane. Therefore, a laser beam La propagating in the +Y-direction after it has been emitted from one laser device 20 reflects on the reflection surface 346A of the vertical flip mirror 346 and propagates as a laser beam Lb toward the +Z-direction.

As shown in FIG. 6, the horizontal flip mirror 348 has a reflection surface 348A with an angle of 45° with respect to the +X-direction on the XY-plane. Therefore, the laser beam Lb propagating in the +Z-direction after it has reflected on the reflection surface 346A of the vertical flip mirror 346 reflects on the reflection surface 348A of the horizontal flip mirror 348 and propagates as a laser beam Lc toward the +X-direction. Thus, the laser beam La emitted from one laser device 20 in the +Y-direction is subjected to two-step reflections in the reflection mirror unit 341 so as to change its direction by 90°, resulting in a laser beam Lc propagating in the +X-direction. The two-step reflections rotate the polarization directions of the major polarization component (TE mode) and the major polarization component (TM mode) of the laser beam Lc, respectively, through 90°. Specifically, the laser beams L1 emitted from the laser device group 23 in the +Y-direction change the direction by 90° with the five reflection mirror units 341 and propagate in the +X-direction. At this stage, the polarization direction of the laser beams L1 has been rotated through 90° since the emission.

Referring back to FIG. 5, the half-wave plate 44 is arranged forward of the laser beams L1 propagating in the +X-direction. Thus, when the laser beams L1 pass through the half-wave plate 44, the polarization directions of the major polarization components (TE mode) and the minor polarization components (TM mode) of the laser beams L1 are recovered to those at the time of the emission.

The beam splitter 50 is arranged forward in the propagation direction of the laser beams L1 that have passed through the half-wave plate 44. Therefore, when the laser beams L1 reach the optical thin film 51 of the beam splitter 50, the major polarization components of the laser beams L1 transmit through the optical thin film 51 and further propagate in the +X-direction (as transmitting major polarization components L33). The minor polarization components of the laser beams L1 reflect on the optical thin film 51, change the direction by 90°, and propagate as reflecting minor polarization components L34 in the −Y-direction.

The condenser lens 70 and the optical fiber 60 are arranged forward in the propagation direction of the transmitting major polarization components L33 (+X-direction). Therefore, the transmitting major polarization components L33 are condensed by the condenser lens 70, optically coupled to the optical fiber 60, which is located in front of the condenser lens 70, and outputted to the exterior of the laser module 301.

A −Y side wall portion 312A of the frame 312 is located forward in the propagation direction of the reflecting minor polarization components L34 (−Y-direction). The laser beam absorption member 80 is provided on a portion of the −Y side wall portion 312A to be irradiated with the reflecting minor polarization components L34 (the minor polarization component irradiation portion 317). The thermistor 90 is embedded in the −Y side wall portion 312A so as to be opposed to the laser beam absorption member 80. With this configuration, the reflecting minor polarization components L34 are irradiated to the laser beam absorption member 80 and converted to heat, which is effectively transferred to the thermistor 90. Particularly, according to the present embodiment, the overall width of the thermistor 90 is opposed to the laser beam absorption member 80 in the plan view (see FIG. 5) as with the first and second embodiments. Therefore, the heat can be transferred to the thermistor 90 in a more effective manner.

As described above, according to the laser module 301 of the present embodiment, minor polarization components from a plurality of laser devices can be collected to one location (the minor polarization component irradiation portion 317) as with the laser module 1 of the first embodiment and the laser module 201 of the second embodiment. Therefore, any failure or deficiency of the laser device(s) can be detected accurately by a small number of thermistors (one thermistor in the present embodiment) arranged at a location where the heat from the portion 317 can be detected.

In the third embodiment, the half-wave plate 44 may not necessarily be provided. In one or more embodiments in which no half-wave plate 44 is provided, the polarization direction of the major polarization components and the minor polarization components of the laser beams L1 that reach the optical thin film 51 has been rotated through 90° by the reflection mirror units 341. Therefore, in one or more embodiments, the major polarization components reflect on the optical thin film 51 and change the direction to the −Y-direction. In one or more embodiments, the minor polarization components transmit through the optical thin film 51 and propagate toward a +X side wall portion 312B of the frame 312. Thus, the same advantageous effects as in the first to third embodiments can be attained by the thermistor provided on the +X side wall portion 312B and the optical fiber 60 provided on the −Y side wall portion 312A.

Although some embodiments of the present invention have been described, the present invention is not limited to the aforementioned embodiments. It should be understood that various different forms may be applied to the present invention within the technical idea thereof. Some examples of other embodiments will be described below.

For example, the aforementioned first to third embodiments describe an example in which a major polarization component of a laser beam emitted from a laser device has a TE mode whereas a minor polarization component thereof has a TM mode. Nevertheless, a major polarization component and a minor polarization component of a laser beam may have any polarization directions that are different by 90°. For example, a major polarization component of a laser beam emitted from a semiconductor laser device may have a TM mode, and a minor polarization component thereof may have a TE mode.

Furthermore, in the aforementioned first to third embodiments, the present invention is applied to a laser module having a plurality of laser devices mounted therein. Nevertheless, the present invention is applicable to a laser module having a single laser device mounted therein. In this case, a minor polarization component of a laser beam emitted from the single laser device is split by the beam splitter and directed to a specific portion of the package housing (i.e., the minor polarization component irradiation portion). Therefore, any deficiency such as failure or power reduction of the single laser device can be detected reliably (accurately) by one or a small number of thermistors arranged so as to detect heat (temperature change) of the specific portion.

In the aforementioned first to third embodiments, the thermistor is embedded in the package housing so as to be opposed to the minor polarization component irradiation portion. The installation location and the installation method of the thermistor may be modified in an appropriate manner as long as the thermistor is attached to the package housing such that heat generated in the minor polarization component irradiation portion is transferred to the thermistor. Such modifications will be described below.

For example, the thermistor may be attached to the minor polarization component irradiation portion. In this case, the thermistor is irradiated directly with the minor polarization components split by the beam splitter, resulting in improved detection precision. In another example, the thermistor may be arranged on a line extending from the minor polarization component irradiation portion along the propagation direction of the minor polarization components split by the beam splitter. In this case, the thermistor is opposed to the minor polarization component irradiation portion, resulting in improved detection precision.

In another example, the thermistor may be attached to an opposite side of the minor polarization component irradiation portion to the beam splitter in the propagation direction of the minor polarization components split by the beam splitter. In this case, the thermistor may be shifted from the position opposed to the minor polarization component irradiation portion toward the +Y-direction or the −Y-direction. Furthermore, the thermistor may be attached to the laser beam absorption member.

The thermistor may be attached directly to an installation site or may be attached indirectly to an installation site via a resin, a thermally conductive member, or the like.

As described above, according to one or more embodiments of the present invention, there is provided a laser module capable of accurately detecting a deficiency of a module with a small number of temperature measurement elements. The laser module has at least one laser device configured to emit a laser beam. The laser beam includes a major polarization component and a minor polarization component having a power lower than a power of the major polarization component and a polarization direction inclined at an angle of 90 degrees with respect to the major polarization component. The laser module has a beam splitter configured to split the laser beam into the major polarization component and the minor polarization component and direct the major polarization component and the minor polarization component in different directions, an optical fiber configured to be optically coupled to the major polarization component split by the beam splitter to externally output the major polarization component, a package housing that houses the at least one laser device and has an inner surface including a minor polarization component irradiation portion to be irradiated with the minor polarization component split by the beam splitter, and at least one temperature measurement element attached to the package housing and configured to detect a temperature change of the minor polarization component irradiation portion.

With this configuration, a minor polarization component of a laser beam emitted from the laser device is split by the beam splitter is directed to a specific portion of the package housing (i.e., the minor polarization component irradiation portion). Therefore, any deficiency of the module (for example, failure or power reduction of the laser device) can be detected accurately with a thermistor arranged at a location where a temperature change of the minor polarization component irradiation portion can be detected. In other words, since thermistors do not need to be arranged in a wide range of the package housing, the number of thermistors being required can be reduced. For example, even if the at least one temperature measurement element is formed by a single temperature measurement element, any deficiency of the module can be detected accurately.

The at least one temperature measurement element may be attached to the minor polarization component irradiation portion. The phrase "to the minor polarization component irradiation portion" intends to refer to a case where the temperature measurement element is attached directly to the minor polarization component portion and a case where the temperature measurement element is attached indirectly to the minor polarization component portion via a resin or the like. With this configuration, any deficiency of the module can be detected more accurately.

The at least one temperature measurement element may be attached to an opposite side of the minor polarization component irradiation portion to the beam splitter in a propagation direction of the minor polarization component split by the beam splitter.

Alternatively, the at least one temperature measurement element may be arranged on a line extending from the minor polarization component irradiation portion along a propagation direction of the minor polarization component split by the beam splitter. With this configuration, since the temperature measurement element is opposed to the minor polarization component irradiation portion, any deficiency of the module can be detected more accurately. In the specification, the term "opposed" intends to cover a case where two members are opposed while another member is interposed therebetween.

In order to detect any deficiency of the module more accurately, a laser beam absorption member capable of absorbing the laser beam may be provided on the minor polarization component irradiation portion.

The at least one laser device may include a plurality of laser devices. In this case, the laser module may further include optics for guiding the minor polarization component of the laser beam from each of the plurality of laser devices to the minor polarization component irradiation portion. With this configuration, the number of deficient (or failed) laser devices can be detected accurately with a small number of thermistors (e.g., one thermistor).

The optics may include a plurality of mirrors configured to guide the laser beam from each of the plurality of laser devices to the beam splitter. The optics may include a half-wave plate configured to rotate the polarization direction of the laser beam from at least one of the plurality of laser devices through 90 degrees.

According to one or more embodiments of the present invention, there is provided a laser apparatus capable of calculating a residual lifetime of a laser module based on data from a temperature measurement element. The laser apparatus has the aforementioned laser module including a plurality of laser devices, a failure count calculator operable to calculate a cumulative number of failed laser devices at a point in time of operation of the laser module based on a signal from the at least one temperature measurement element, and a remaining lifetime calculator operable to calculate a residual lifetime of the laser module based on the cumulative number of failed laser devices calculated by the failure count calculator.

The remaining lifetime calculator may be operable to calculate the residual lifetime D from a formula $D=(N-n) \times T$ based on an average time-to-failure T of the plurality of laser devices that is determined by an electric current supplied to the laser module at the point in time of operation, the cumulative number n of failed laser devices, and a permissible number N of failed laser devices in the laser module.

According to one or more embodiments of the present invention, there is provided a laser module capable of accurately detecting a deficiency of a module with a small number of temperature measurement elements.

The terms "below," "on," "bottom," "upward," "downward," "upper," "lower," and other positional terms described herein are used in connection with the illustrated embodiments and may be varied depending on the relative positional relationship between components of the apparatus.

The present invention may be used for a laser module that can detect deficiency of the laser module.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1, 201, 301 Laser module
2 Processor
3 Monitor
10, 210, 310 Package housing
11, 211, 311 Bottom plate
12, 212, 312 Frame
13, 213 Stepped portion
14, 214 Base portion
15A-15E Mount surface
17, 217, 317 Minor polarization component irradiation portion
20, 30 Laser device
21, 31 Submount
23 First laser device group
24, 34 Lead wire
26, 36 Bonding wire
33 Second laser device group
40 Optics
41-42 Reflection mirror
44 Half-wave plate
50 Beam splitter
51 Optical thin film
60 Optical fiber
70 Condenser lens
80 Laser beam absorption member
90 Thermistor (temperature measurement element)
91 Wire
100 Laser apparatus
121 Failure count calculator
122 Failure period calculator
123 Allowable failure count storing portion
124 Remaining lifetime calculator
215A-215E Mount surface
341 Reflection mirror
346 Vertical flip mirror
346A, 348A Reflection surface
348 Horizontal flip mirror
L3 Combined major polarization component
L4 Combined minor polarization component
L23, L33 Transmitting major polarization component
L24, L34 Reflecting minor polarization component

The invention claimed is:

1. A laser module comprising:
a laser device that emits a laser beam comprising:
   a major polarization component; and
   a minor polarization component having:
      a power lower than a power of the major polarization component; and
      a polarization direction inclined at an angle of 90 degrees with respect to a polarization direction of the major polarization component;
a beam splitter that splits the laser beam into the major polarization component and the minor polarization component and that directs the major polarization component and the minor polarization component in different directions;
an optical fiber that is optically coupled to the major polarization component split by the beam splitter and externally outputs the major polarization component;
a package housing that houses the laser device and that has an inner surface comprising a minor polarization component irradiation portion that is irradiated by the minor polarization component split by the beam splitter; and
a temperature measurement element that is attached to the package housing and that detects a temperature change of the minor polarization component irradiation portion.

2. The laser module according to claim 1, wherein the laser module does not comprise any other temperature measurement element that detects the temperature change of the minor polarization component irradiation portion.

3. The laser module according to claim 1, wherein the temperature measurement element is attached to the minor polarization component irradiation portion.

4. The laser module according to claim 1, wherein the temperature measurement element is attached to an opposite side to the beam splitter with respect to the minor polarization component irradiation portion in a propagation direction of the minor polarization component.

5. The laser module according to claim 1, wherein the temperature measurement element is disposed on a line extending from the minor polarization component irradiation portion along a propagation direction of the minor polarization component.

6. The laser module according to claim 1, further comprising:
a laser beam absorption member that absorbs the laser beam on the minor polarization component irradiation portion.

7. The laser module according to claim 1, further comprising:
one or more other laser devices each of which emits a laser beam comprising:
   a major polarization component; and
   a minor polarization component having:
      a power lower than a power of the major polarization component; and
      a polarization direction inclined at an angle of 90 degrees with respect to a polarization direction of the major polarization component; and
optics that guide the minor polarization component of the laser beam from each of the laser device and the one or more other laser devices to the minor polarization component irradiation portion.

8. The laser module according to claim 7, wherein the optics comprise mirrors that guide the laser beam from each of the laser device and the one or more other laser devices to the beam splitter.

9. The laser module according to claim 7, wherein the optics comprise a half-wave plate that rotates the polarization direction of the laser beam from at least one of the laser device and the one or more other laser devices by 90 degrees.

10. The laser module according to claim 7, further comprising a condenser lens that condenses the major polarization component of the laser beam from each of the laser device and the one or more other laser devices and optically couple the condensed light to the optical fiber.

11. A laser apparatus comprising:
the laser module according to claim 7;

a failure count calculator that calculates, based on a signal from the temperature measurement element, a cumulative number of failed laser devices; and a remaining lifetime calculator that calculates a residual lifetime of the laser module based on the cumulative number of failed laser devices calculated by the failure count calculator.

12. The laser apparatus according to claim 11, wherein the remaining lifetime calculator calculates the residual lifetime D from a formula:

$$D=(N-n)\times T$$

where

T is an average time-to-failure of the laser device and the one or more other laser devices that is determined by an electric current supplied to the laser module, n is the cumulative number of failed laser devices, and N is a permissible number of failed laser devices in the laser module.

* * * * *